(12) United States Patent
Chien

(10) Patent No.: US 6,307,803 B1
(45) Date of Patent: Oct. 23, 2001

(54) DYNAMIC RANDOM ACCESS MEMORY SUITABLE FOR USE AS A COMPATIBLE TRANSISTOR OF A STATIC RANDOM ACCESS MEMORY AND THE METHOD FOR OPERATING THE SAME

(76) Inventor: Plen Chien, No. 144, Chi-Long Rd. Sec. 3, Taipei (TW)

( * ) Notice: Subject to any disclaimer, the term of this patent is extended or adjusted under 35 U.S.C. 154(b) by 0 days.

(21) Appl. No.: 09/749,358

(22) Filed: Dec. 27, 2000

(30) Foreign Application Priority Data

Nov. 17, 2000 (TW) .................................................. 89124359

(51) Int. Cl.$^7$ ....................................................... G11C 7/00
(52) U.S. Cl. .......................... 365/227; 365/226; 365/205; 365/233
(58) Field of Search .................................... 365/227, 226, 365/233, 222, 228, 229, 205, 196, 189.06, 189.09

(56) References Cited

U.S. PATENT DOCUMENTS 6,181,629 * 1/2001 Ogura .................................... 365/227

* cited by examiner

Primary Examiner—David Nelms
Assistant Examiner—David Lam
(74) Attorney, Agent, or Firm—Jiawei Huang; J. C. Patents

(57) ABSTRACT

A dynamic random access memory suitable for use as a compatible transistor of a static random access memory and the method for operating the same. A static random access memory with a single transistor is applied to effectively store the data saved in the dynamic random access memory without being lost. In addition, the dynamic random access memory can be operated under a low voltage to retain the data stored in the dynamic random access memory cell, and to reduce the power consumption. With the structure of such dynamic random access memory, the data stored in the dynamic random access memory can be retained under the stand-by mode, and the operation power consumption can be reduced.

21 Claims, 5 Drawing Sheets

DYNAMIC RANDOM ACCESS MEMORY SUITABLE FOR USE AS A COMPATIBLE TRANSISTOR OF A STATIC RANDOM ACCESS MEMORY AND THE METHOD FOR OPERATING THE SAME

CROSS-REFERENCE TO RELATED APPLICATION

This application claims the priority benefit of Taiwan application serial no. 89124359, filed Nov. 17, 2000.

BACKGROUND OF THIS INVENTION

1. Field of the Invention

This invention relates to a dynamic random access memory (DRAM) and a method for operating the same, and more particularly, to a structure and an operating method for a dynamic random access memory suitable for use as a compatible transistor of a static random access memory (SRAM). The dynamic random access memory is used as the compatible transistor of a static random access memory, that is, a static random access memory with a single transistor.

2. Description of Related Prior Art

A conventional dynamic random access memory comprises a transistor and a capacitor. The area and fabrication cost of the dynamic random access memory is much smaller than those of a static random access memory cell since the conventional static random access memory comprises 4 to 6 transistors. Therefore, to replace the static random access memory with the dynamic random access memory becomes a goal that the industry has endeavored to reach.

However, the data stored in the dynamic random access memory cell has to be refreshed periodically. Such operation is not required for the data stored in the static random access memory. The refresh operation of the dynamic random access memory cell wastes a significant bandwidth of the memory. For example, the clock time of a dynamic random access memory cell operated with a frequency of 100 MHz is 10 nsec. The time for storing a data externally is 10 nsec, and the refresh time is also 10 nsec. The actual refresh time can range from 16 to 500 nsec, depending on the specific circuit design and the capacity of the memory. Thus, the dynamic random access memory has to be idled once for every 500 nsec. The efficiency is consequently dropped to 50–90%. This consideration further reduces the bandwidth of operation.

In the prior art, an attempt for using the dynamic random access memory in the static random access memory has been made. Yet, the property of storing data for a long term has not been achieved since such dynamic random access memory requires an external signal to control the refresh operation. As a consequence, the static random access memory is delayed due to the refresh operation, so the dynamic random access memory is not compatible with the static random access memory.

In other prior art, a high speed static random access memory cache has been used together with a relatively low speed dynamic random access memory to increase the average access time for memory (U.S. Pat. No. 5,559,750). The actual access time for such a structure is dependent on the hit rate of the static random access memory cache, and an additional circuit is required to provide the refresh operation of the dynamic random access memory. Such a structure is still affected by the external access operation, so that a random access time for the integrated structure cannot be achieved.

In another structure, a dynamic random access memory with many memory cell rows is used to reduce the access time of the dynamic random access memory. However, this structure does not allow for the delay of one of the memory cell rows for refresh.

In U.S. Pat. No. 6,028,804, a static random access memory using a dynamic random access memory has been disclosed. An access arbiter is used to arbitrate between the clock required by external access and the generated refresh clock. The clock of the external access has priority in order to avoid a conflict, and it is inevitable that this structure will lose a portion of the operation frequency.

SUMMARY OF THIS INVENTION

This invention provides a structure and an operating method for a static random access memory using a dynamic random access memory. The data stored in the dynamic random access memory can be effectively retained without affecting the normal operation of the static random access memory.

The static random access memory can retain the data stored in the dynamic random access memory under a low voltage operational condition, and the power consumption for the operation can be effectively reduced.

In standby mode or sleep mode, the data stored in the dynamic random access memory can still be retained with a lower power consumption.

The dynamic random access memory suitable for use as a compatible transistor of a static random access memory is operated under a normal operation mode and a low voltage operation mode. Such dynamic random access memory structure uses a reference clock signal as the reference for operation. A memory cell is included to store a data. A sense amplifier comprising a sense unit, a first transistor and a second transistor is further included. The sense unit is coupled to the first transistor, the second transistor, a bit line and a complementary bit line. The bit line and the complementary bit line are used to access and refresh the data stored in the memory cell. The frequency for refreshing the data stored in the memory cell depends on the reference clock signal. The dynamic random access memory structure further comprises a switch to receive a first and a second voltage. Either one of the first and the second voltage is output as an operation voltage. The potential level of the first voltage is higher than the potential level of the second voltage. When the dynamic random access memory structure is operated under a normal operation mode, the second voltage is provided as the operation voltage for the dynamic random access memory. The power consumption for this operation can be reduced. When the dynamic random access memory is operated under the low voltage, the first voltage is the operation voltage to maintain data stored in the memory cell of the dynamic random access memory.

In the above dynamic random access memory structure, the memory cell comprises a third transistor and a capacitor. One terminal of the capacitor is connected to one source/drain of the third transistor, while the other terminal of the capacitor is connected to a third voltage. The other source/drain of the third transistor is coupled to the bit line. Under the normal operation mode, the third voltage is a proportion of the operation voltage, while the third voltage is smaller than the operation voltage. When the dynamic random access memory is operated under a low voltage mode, the third voltage drops to 0 voltage when the reference clock signal is at a low voltage of 0. The required voltage for maintaining the data stored in the memory cell of the dynamic random access memory is thus reduced.

The third transistor comprises a substrate coupled to a substrate bias which is provided by the reference clock signal.

The dynamic random access memory structure further comprises a voltage drop apparatus coupled to the first voltage of the switch and outputting the second voltage to the switch.

The invention further provides a dynamic random access memory structure suitable for use as a compatible transistor of a static random access memory. The dynamic random access memory structure is operated under one of either a normal operation mode, a stand-by mode or a sleep mode. A reference clock signal is used as a reference for operation. A memory cell is included by the dynamic random access memory for storing data, and a sense amplifier comprising a sense unit, a first transistor, a second transistor, a bit line and a complementary bit line is also included. The bit line and the complementary bit line are used to access and refresh the data stored in the memory cell. The frequency for refreshing the data stored in the memory cell depends on the reference clock signal. The dynamic random access memory structure further comprises a switch to receive a first and a second voltage and select one of them as the operation voltage. The first voltage has a potential level higher than the second voltage. When the dynamic random access memory is operated under a normal mode, the second voltage is the operation voltage to save the consumption power. When the dynamic random access memory is under a stand-by mode, according to the reference clock signal, either the first voltage or the second voltage is selected as the operation voltage. When the dynamic random access memory is under a sleep mode, the operation voltage is fixed as the first voltage to retain the data stored in the memory cell.

The memory cell in the above structure comprises a third transistor and a capacitor. One terminal of the capacitor is coupled to one source/drain of the third transistor, while the other terminal of the capacitor is coupled to a third voltage. The other source/drain of the third transistor is coupled to the bit line, and a gate of the third transistor is coupled to a word line. When the dynamic random access memory structure is operated under a normal mode, the third voltage is a proportion of the operation voltage, while the third voltage is smaller than the operation voltage. When the dynamic random access memory structure is operated under the sleep mode, the third voltage drops to zero when the reference clock signal is at the low voltage level of zero to reduce the voltage required to retain the data stored in the memory cell.

The substrate of the third transistor is coupled to a substrate bias provided according to the reference clock signal.

The invention further provides a method for operating a dynamic random access memory structure suitable for use as a compatible transistor of a static random access memory. The dynamic random access memory structure comprises a memory cell, a sense amplifier and a switch. The dynamic random access memory structure is operated under a normal operation mode and a low voltage operation mode. A first voltage and a second voltage are provided. One of the first and the second voltages is switched as an operation voltage, while the first voltage is higher than the second voltage. A reference clock signal is provided as an operation signal. A data is stored in the memory cell. According to the sequence frequency of the reference clock signal, the data stored in the memory cell is refreshed. Under the normal operation mode, the second voltage is provided as the operation voltage to save the power consumption. While operated under the low operation voltage mode, the first voltage is provided as the operation voltage to maintain the data stored in the memory cell.

In the above operation method, the memory cell comprises a third transistor and a capacitor. One terminal of the capacitor is coupled to one source/drain of the third transistor, while the other terminal of the capacitor is coupled to a third voltage. The other source/drain of the third transistor is coupled to the bit line, and a gate of the third transistor is coupled to a word line. While operated under a normal operation mode, the third voltage is a proportion of the operation voltage larger than the third voltage. Under the low voltage operation mode, the third voltage is dropped to 0 voltage when the reference clock signal has a potential of zero voltage. The voltage required for retaining the data stored in the memory cell is thus reduced.

In the above method, when the dynamic random access memory structure is operated under a normal mode, the second voltage is provided as the operation voltage to provide the operation of the dynamic random access memory, so as to save the power consumption. When the dynamic random access memory is operated under a stand-by mode, according to the reference clock signal, either the first voltage or the second voltage is selected as the operation voltage. When the dynamic random access memory structure is operated under a sleep mode, the first voltage is selected as the operation for maintaining the data stored in the memory cell.

The memory cell comprises a third transistor and a capacitor. One terminal of the capacitor is coupled to one source/drain of the third transistor, while the other terminal of the capacitor is coupled to a third voltage. The other source/drain of the third transistor is coupled to the bit line, and a gate of the third transistor is coupled to a word line. Under a normal operation mode, the third voltage is a proportion of the operation voltage larger than the third voltage. Under the low voltage operation mode, the third voltage is dropped to 0 voltage when the reference clock signal has a potential of zero voltage. The voltage required for retaining the data stored in the memory cell is thus reduced.

Both the foregoing general description and the following detailed description are exemplary and explanatory only and are not restrictive of the invention, as claimed.

BRIEF DESCRIPTION OF DRAWINGS

The invention can be more fully understood by reading the following detailed description of the preferred embodiment, with reference made to the accompanying drawings.

PREFERRED EMBODIMENT

An embodiment of the invention provides a static random access memory, especially, the structure and operation method of the static random access memory widely applied to mobile electronic equipment.

In this embodiment, the static random access memory uses a dynamic random access memory cell as the source for storing data. Since a dynamic random access memory comprises a single transistor and a capacitor only, the area and fabrication costs are much smaller than those for static random access memory comprising 4 to 6 transistors. By overcoming the refresh problem and ensuring that the stored data is not lost, the fabrication cost of the static random access memory can be greatly reduced.

The static random access memory comprised of only one transistor (1-T SRAM) can effectively retain the data stored in the dynamic random access memory cell. In addition, the static random access memory structure can be operated under a low voltage condition without losing the data stored in the dynamic random access memory cell with less power consumption.

Furthermore, under a stand-by mode or a sleep mode, the data stored in the dynamic random access memory cell can be maintained, and the power consumption of the static random access memory can be reduced. The stand-by mode refers to a state where the provided energy is still enough, and as there is no operation, the system enters a low voltage state to reduce the power consumption. The sleep mode means that though the energy is not sufficient, it is still higher than the operable specification. The current processed data lasts for a long time with limited energy to enable a user to retrieve the data without any loss.

The above two modes are frequently applied to electronic equipment using a battery with a limited lifetime such as a cellular phone, portable computer, and personal data assistant. As the static random access memory can store the data for a long term, when using a dynamic random access memory cell comprising a single transistor and a capacitor as the static random access memory, many factors have to be considered, for example, under a low voltage operation such as a stand-by mode or sleep mode, how to refresh the stored data in the dynamic random access memory and how to retain the data.

Figure 1:
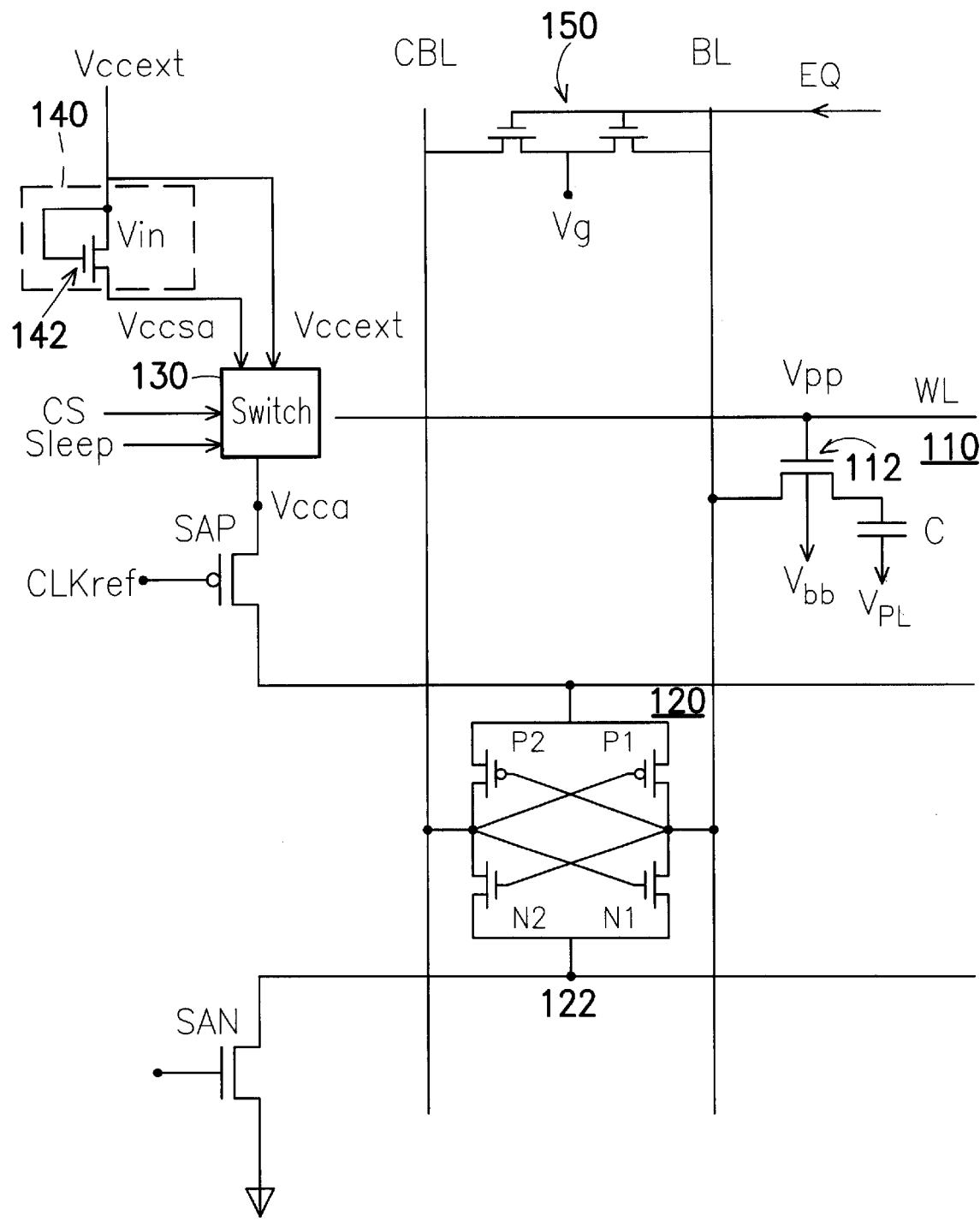
FIG. 1 shows a dynamic random access memory structure suitable for use as a storing device of a static random access memory.

In FIG. 1, a dynamic random access memory structure used as the storing device of a static random access memory is shown. In this embodiment, a single memory cell and a single sense amplifier are used as an example for description. It is appreciated that more than one memory cell and sense amplifier can be included in this dynamic random access memory structure, but the structure and the operating method are similar for each memory cell and sense amplifier.

The operation voltage of the static random access memory is defined as Vcca under a normal operation condition. Under the normal operation condition, the operation voltage Vcca is equivalent to an external voltage Vccext. While entering a stand-by mode, to save the consumed power, the operation voltage Vcca drops from the external voltage Vccext to a predetermined value. For example, as shown in FIG. 1, via the voltage drop apparatus 140, the operation voltage is dropped to Vccsa as the output operation voltage Vcca.

The single transistor static random access memory structure comprises a memory cell 110, a sense amplifier 120, a switch 130, a voltage drop apparatus 140 and an equalizer 150.

The memory cell 110 comprises a transistor 110 and a capacitor C. The capacitor C comprises a terminal coupled to one source/drain of the transistor 112, and the other terminal coupled to a voltage source $V_{PL}$. The voltage source $V_{PL}$ is one half of the operation voltage Vcca under a normal operation condition. The transistor 112 has the other source/drain coupled to a bit line BL, and a gate coupled to a word line (WL). In addition, the substrate of the transistor is coupled to a substrate bias Vbb. Under the normal operation condition, Vbb is −1V which is advantageous to the low voltage operation of the transistor 112. In addition, the voltage to turn on the transistor 112 is referred as Vpp. The voltage Vpp is provided from the word line WL.

The sense amplifier 120 comprises a sense unit, a P-type metal-oxide semiconductor transistor (PMOS) SAP, and an N-type metal-oxide semiconductor transistor (NMOS) SAN. The sense unit comprises PMOS transistor P1 and P2 and NMOS transistors Ni and N2. The connection is similar to typical sense amplifier. That is, the gates of the NMOS transistor N2 and the gate of the PMOS transistor P2 are coupled to the bit line BL. The gates of the PMOS transistor P1 and NMOS transistor N1 are coupled to a complementary bit line CBL. The bit line BL and complementary bit line CBL are used to access the data stored in the memory cell 110.

One source/drain region of each of the PMOS P1 and the PMOS P2 are coupled to one source/drain region of the PMOS transistor SAP. The other source/drain regions of the PMOS P1 and the PMOS P2 are coupled to source/drain regions of the NMOS transistors N1 and N2. The other source/drain regions of the NMOS transistors N1 and N2 are coupled the other source/drain region of the NMOS transistor SAN. The PMOS transistor SAP comprises the other source/drain region coupled to the switch 130. The other source/drain region of the NMOS transistor SAN is grounded.

The switch 130 receives two voltage sources Vccext and Vccsa and switches between these two. The voltage source Vccsa is smaller than a predetermined potential level of the voltage source Vccext. In this method, via the voltage drop apparatus 140, the voltage source Vccext can be converted as the voltage source Vccsa. In practical application, a threshold voltage Vtn of a transistor 142 can be used to achieve the voltage conversion. The magnitude of Vccsa is equivalent to the Vccext that drops to Vtn. The switch operation of the switch 130 can be controlled by a control signal CTL.

The access operation of the dynamic random access memory structure used as the storing device of the static random access memory under normal operation condition is described as follows.

Under the normal operation condition, an external voltage uses the Vccext as the operation voltage of Vcca. The capacitor C of the memory cell 110 is coupled to a voltage $V_{PL}$, which is set at a half of the operation voltage Vcca, to accelerate the operation of the memory cell 110. The substrate bias Vbb is set at −1V to reduce the threshold voltage.

At the pre-charge stage before access the memory cell 100, the equalizer 150 charges the two bit lines BL and CBL to a certain voltage, which is typically a half of Vcca, via the control of the voltage Vg. The equalizer 150 comprises two MOS transistors. The voltage $V_{EQ}$ of the control gate signal EQ at this stage is high ("1"), to charge these two bit lines BL and CBL to the predetermined voltage.

After the word line WL is selected, the charges are shared between the memory cell 110 and the bit line BL. If the data stored in the memory cell 110 is "1", the potential of the bit line BL is increased to larger than a half of the operation voltage Vcca. Meanwhile, the potential of the complementary bit line CBL is dropped to be slightly lower than a half of the operation voltage Vcca.

After the sense amplifier 120 and the NMOS transistor SAN are conducted, that is, after the node 122 is grounded, the sense amplifier 120 starts operating. That is, the NMOS transistor N2 is conducted to pull the complementary bit line CBL down to ground. As the complementary bit line CBL is grounded, the PMOS transistor P1 is conducted. Thus, the PMOS transistor SAP is conducted to the operation voltage Vcca. Via the bit line BL, capacitor C of the memory cell 110 is charged up to Vcca to refresh to the predetermined voltage level.

Figure 2:
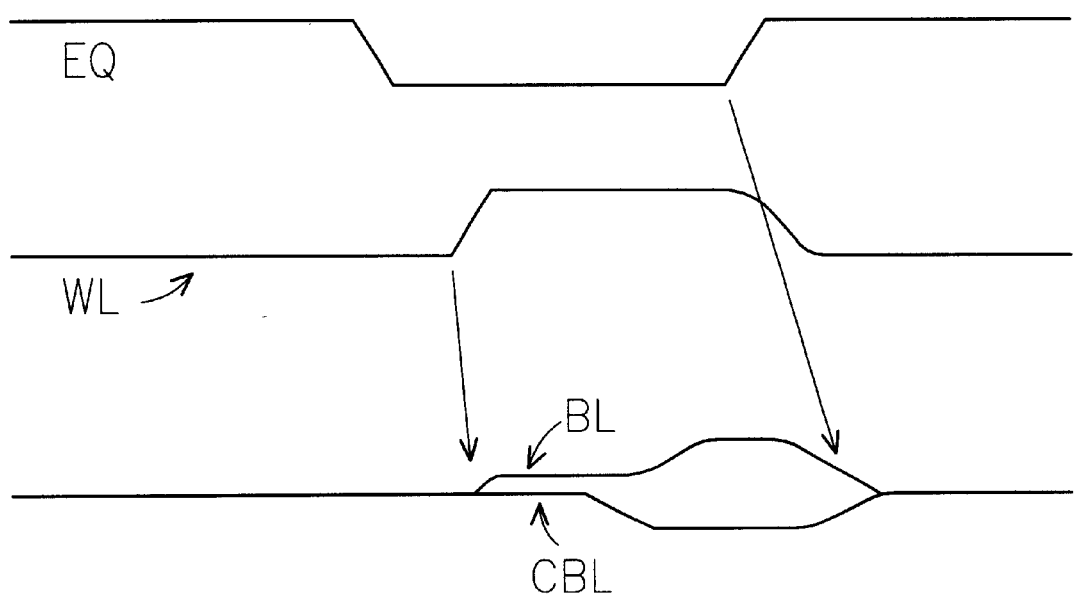
FIG. 2 shows a sequence diagram for data access and memory cell refresh for the dynamic random access memory structure as shown in FIG. 1.

The access process is depicted in FIG. 2. For example, when the control gate signal EQ stops pre-charging and the word line WL is converted to 1, the voltage of the bit line BL raised one bit. After the NMOS transistor SAN is conducted, the voltage of the bit line BL raises to high to refresh the capacitor C of the memory cell 110 to the predetermined value.

If the data stored in the memory cell 110 is "0", the operation process is similar. The voltage of the bit line BL drops to less than a half of operation voltage Vcca when the bit line raises to high (logic 1). The voltage of the complementary bit line CBL is slightly higher than a half of the operation voltage Vcca.

After the NMOS transistor SAN of the sense amplifier 120 is conducted, that is, after the node 122 is grounded, the sense amplifier 120 starts operating. That is, the NMOS transistor N1 is conducted, and the voltage of the bit line is pulled down to ground. As the bit line BL is grounded, the PMOS transistor P2 is conducted to pull the voltage of the bit line CBL to the operation Vcca. Meanwhile, the voltage of the bit line BL is dropped to a minimum to discharge the capacitor C of the memory cell 110, so as to refresh the value "0" of the memory cell 110.

The operation process of the dynamic random access memory structure under the low voltage operation mode (such as stand-by mode or sleep mode) is described as follows.

Figure 3:
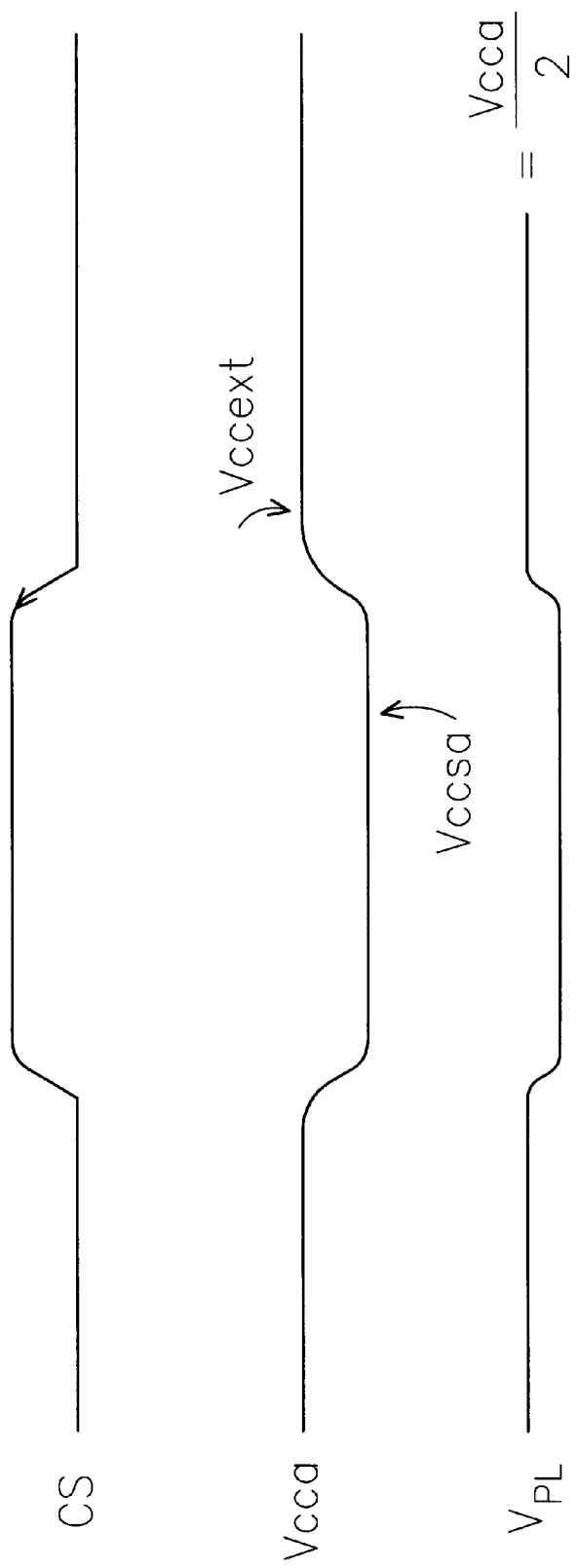
FIG. 3 shows a sequence diagram under a low voltage operation mode for a dynamic random access memory used as a storing device of a static random access memory.

In the system using the dynamic random access memory structure, without distinguishing the stand-by mode that reduces the power consumption or the sleep mode with a further reduction of the power consumption, the general low voltage operation is illustrated as FIG. 1 and FIG. 3. By controlling the switch 130 with CS, the value of the operation voltage Vcca is reduced from Vccext to Vccsa. The values of $V_{PL}$ and $V_{EQ}$ are also dropped from a half of Vccext to a half of Vccsa. In the invention, by increasing the operation voltage of the switch 130 that controls the system, the objective of power consumption can be achieved.

Figure 4:
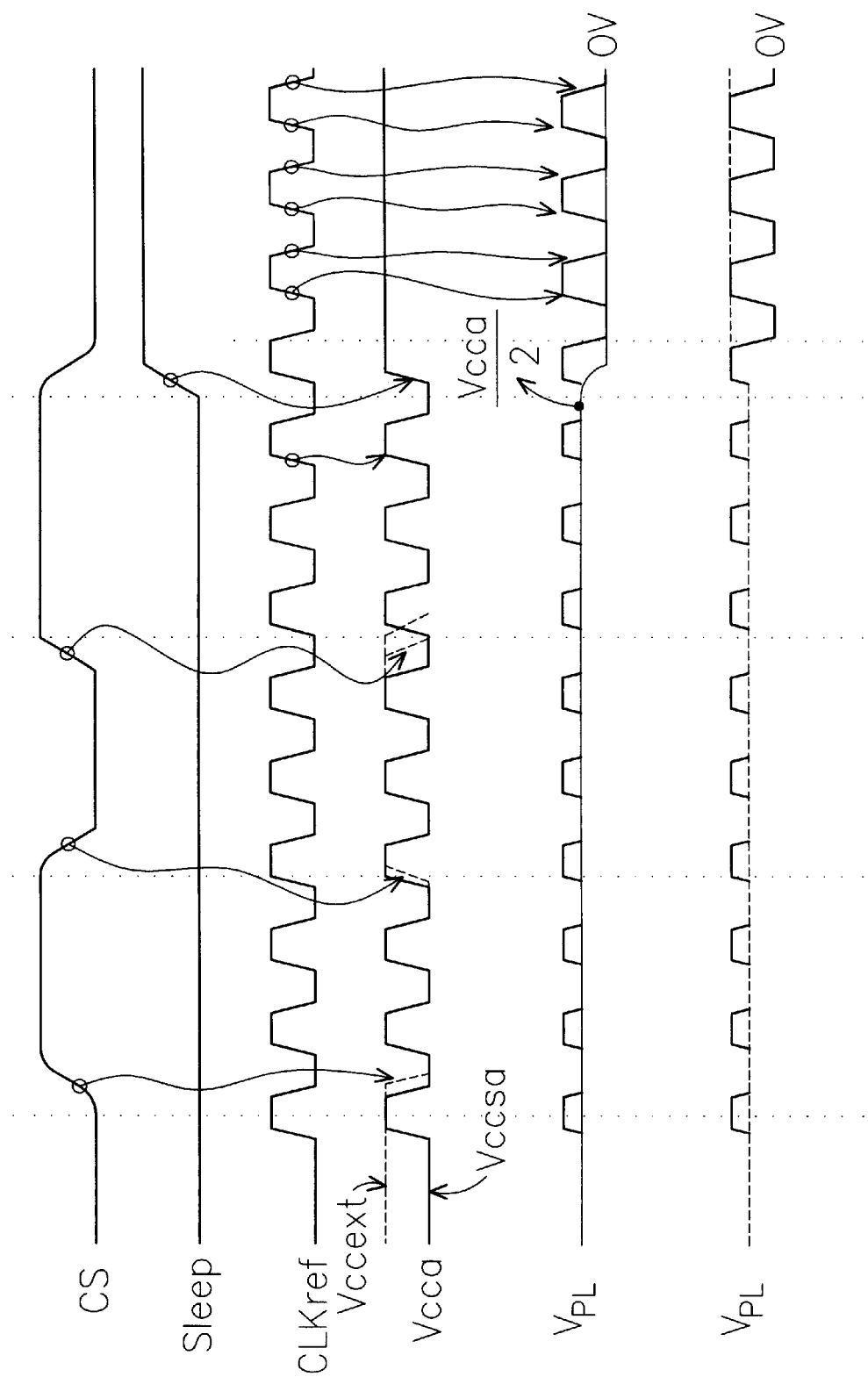
FIG. 4 shows a sequence diagram under a stand-by mode and a sleep mode for a dynamic random access memory used as a storing device of a static random access memory.

The dynamic random access memory structure in a stand-by mode with a reduced power consumption or a sleep mode with a further reduced power consumption can be referred to FIG. 1 and FIG. 4. To reduce the power consumption of the whole system, in the embodiment, the dynamic random access memory uses an external clock signal CLKref as the clock source. All the operations are according to the external clock signal CLKref without an addition clock generator to generate an internal clock signal.

In the normal stand-by mode, by the control of a reverse value of the signal CS, the operation voltage is switched between Vccext and Vccsa. Meanwhile, the values of $V_{PL}$ and $V_{EQ}$ are switched as a half of Vccext or Vccsa to save the power consumption.

In the sleep mode, as the residual electric energy is too low, a low voltage has to be maintained, while the data stored in the DRAM cell has to retained. Thus, many factors have to be considered.

As shown in FIG. 4, a sleep enable signal Sleep to provide that the system enter the sleep mode is provided. After the sleep signal Sleep is enabled, that is, at the high voltage level (logic 1), the operation voltage is converted as Vccext without voltage drop. This can be achieved by controlling the switch 130 with the signal Sleep as shown in FIG. 1. In this power saving status, all the word lines are switched off as the reference clock CLKref is at a low voltage level, that is, all at zero volt. In addition, the reference clock signal CLKref is also the source of clock for the substrate bias Vbb providing the transistor 112 of the memory cell 110.

In this embodiment, the same clock signal, that is, the above reference clock signal, is the reference for the system of the dynamic random access memory structure. The reference clock signal is provided by an external system, not by the additional clock generator of the dynamic random access memory. This is different from the conventional dynamic random access memory structure that requires three internal clocks. Thus, the power consumed for generating the clock is reduced to achieve the objective of reducing power consumption.

The charges stored in the capacitor C of the memory cell 110 determine the voltage drop between two terminals of the capacitor C. Assuming that the external voltage Vccext is 3V, the value of Vccsa after voltage drop is 2V. Alternatively, if the external voltage Vccext is 2V, the value of Vccsa after voltage drop is 1.5V. In this condition, even under the sleep mode, the data stored in the memory cell 110 can be effectively retained.

If the external voltage is further dropped as is a tendency of the current portable electronic equipment, for example, Vccext=1.5V only, since the operation voltage is switched to Vccsa=Vccext=1.5V, the voltage $V_{PL}$ at the other terminal of the capacitor C is only a half of Vcca. That is, the voltage $V_{PL}$ is about 0.7V. Under this circumstance, the charges stored in the capacitor C are Q1=C×(1.5V–0.7V)×k=C×0.8× k. k is the charge sharing effect parameter. The magnitude of the stored charges is too low, so that the sense amplifier 120 cannot effectively detect the stored magnitude. There is thus a worry for data loss.

At this time, the memory cell 110 can be changed selectively. For example, the voltage $V_{PL}$ is changed from a half of the operation voltage Vcca in the normal operation mode according to the clock signal CLKref That is, the voltage $V_{PL}$ is changed from 0V to a half of Vcca (actually, a half of Vccext). Therefore, under the sleep mode, power saving can be achieved without providing the efficiency $V_{PL}$ to improve the operation efficiency. The voltage $V_{EQ}$ used to charge the bit line is also switched to 0 or a half of Vcca according to the clock signal CLKref.

Figure 5:
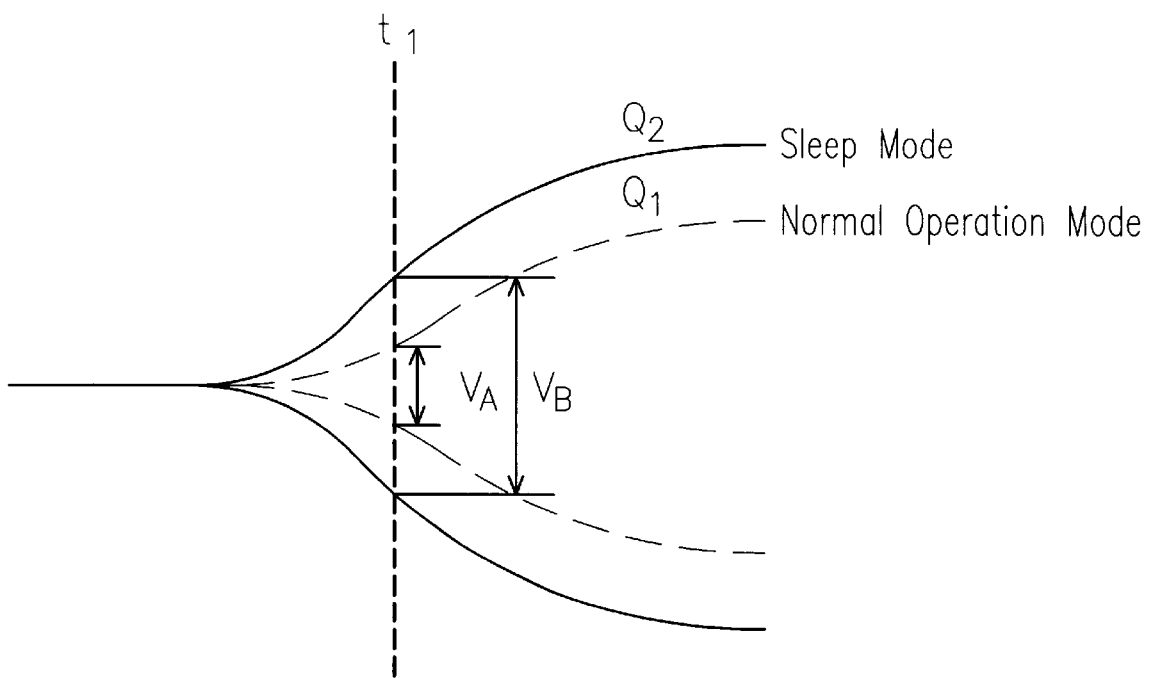
FIG. 5 shows a comparison of the storing charges under normal operation mode and sleep mode for a dynamic random access memory used as a storing device of a static random access memory.

Such a structure operated at a low voltage has a significant effect. For example, assuming that the system is switched to sleep mode at t1, the stored charges of the capacitor C are Q1=C×(1.5V–0V)×k=C×1.5×k which is much higher than the previous C×0.8×k. There is thus no worry that the sense amplifier 120 will be unable to detect the stored data. In addition, as shown in FIG. 5, at the same time t1, the stored charges at sleep mode in this embodiment have a significant difference from normal mode.

In the embodiment, the voltage $V_{PL}$ coupled to one terminal of the capacitor and the voltage to charge the bit line $V_{EQ}$ are also used at a non-low voltage operation condition. However, the effect is not as significant as the low voltage operation.

In the invention, the application of the single transistor static random access memory structure can effectively maintain the data stored in the dynamic random access memory cell without loss. According to the structure, the data stored in the dynamic random access memory cell can be retained under the low voltage operation, and the power consumption of the static random access memory can be reduced.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A dynamic random access memory structure suitable for use as a compatible transistor in a static random access memory, wherein the dynamic random access memory structure is operated under a normal operation mode and a low voltage operation mode, and uses a reference clock signal as an operation accordance, the dynamic random access memory comprising:

a memory cell, to store a data;

a sense amplifier, comprising sense unit, a first transistor and a second transistor, wherein the sense unit is connected to the first transistor, the second transistor, a bit line and a complementary bit line, the bit line and the complementary bit line are used to access and refresh the data stored in the memory cell, and a frequency for refreshing the data stored in the memory cell is according to the reference clock signal; and a switch, to receive a first voltage and a second voltage, and to select one of the first and the second voltages, wherein the first voltage has a voltage level higher than a voltage level of the second voltage; wherein when the dynamic random access memory structure is operated under the normal operation mode, the second voltage is an operation voltage to provide the operation of the dynamic random access memory structure to reduce power consumption; and when the dynamic random access memory structure is operated under the low voltage operation mode, the first voltage is the operation voltage to retain the data stored in the memory cell.

2. The dynamic random access memory structure according to claim 1, wherein the memory cell comprises a third transistor and a capacitor, one terminal of the capacitor is coupled to one source/drain region of the third transistor, the other terminal of the capacitor is coupled to a third voltage, the other source/drain region of the third transistor is coupled to the bit line, and a gate of the third transistor is coupled to the word line, wherein when the dynamic random access memory structure is operated under the normal operation mode, the third voltage is a proportion of the operation voltage and is smaller than the operation voltage; and when the dynamic random access memory structure is operated under a low voltage mode, the third voltage is dependent on the reference clock signal, and when the reference clock signal is at a low voltage level as logic 0, the third voltage drops to zero voltage to reduce the voltage required to retain the data stored in the memory cell.

3. The dynamic random access memory structure according to claim 2, wherein when the dynamic random access memory is operated under the normal operation mode, the third voltage is a half of the operation voltage.

4. The dynamic random access memory structure according to claim 1, wherein the transistor of the memory cell comprises a substrate coupled to a substrate bias.

5. The dynamic random access memory structure according to claim 4, wherein substrate bias is provided by the reference clock signal.

6. The dynamic random access memory structure according to claim 1, comprising further a voltage drop apparatus coupled to the switch and the first voltage, and to output the second voltage to the switch.

7. The dynamic random access memory structure according to claim 6, wherein the voltage drop apparatus comprises a fourth transistor, and a difference between the first and the second voltages is a threshold voltage of the fourth transistor.

8. The dynamic random access memory structure according to claim 1, wherein a switch operation of the switch is controlled by the first or the second voltage selected and controlled by a control signal.

9. A dynamic random access memory structure suitable for use as a compatible transistor of a static random access memory, wherein the dynamic random access memory structure is operated under one of either a normal operation mode, a stand-by mode or a sleep mode according to a reference clock signal, the dynamic random access memory comprising:

a memory cell, to store a data;

a sense amplifier, comprising a sense unit, a first transistor and a second transistor, the sense unit is coupled to the first transistor, the second transistor, a bit line and a complementary bit line, wherein the bit line and the complementary bit line are used to access and refresh the data stored in the memory cell, a frequency for refreshing the data stored in the memory cell is according to the reference clock signal; and a switch, to receive a first voltage and a second voltage, and to switch between one of the first and the second voltage as an operation voltage, wherein the first voltage is higher than the second voltage, and wherein when the dynamic random access memory structure is operated under the normal operation mode, the operation voltage is the second voltage to provide the operation of the dynamic random access memory structure and to save operation power consumption;

when the dynamic random access memory structure is operated under the stand-by mode, the voltage is adjusted as the first or the second voltage according to the reference clock signal; and when the dynamic random access memory structure is operated under the sleep mode, the operation voltage is fixed as the first voltage to provide the operation of the dynamic random access memory structure, and to maintain the data stored in the memory cell.

10. The dynamic random access memory structure according to claim 9, wherein the memory cell comprises a third transistor and a capacitor, the capacitor has one terminal coupled to one source/drain region of the third transistor, and the other terminal coupled to a third voltage, the third transistor further comprises the other source/drain region coupled to the bit line and a gate coupled to a word line; wherein when the dynamic random access memory structure is operated under the normal operation mode, the third voltage is a proportion of the operation voltage and is smaller than the operation voltage; and when the dynamic random access is operated under the sleep mode, the third voltage is dependent on the reference clock signal, and when the reference clock signal is at a low voltage level of logic 0, the third voltage drops to zero voltage to maintain a voltage required to retain the data stored in the memory cell.

11. The dynamic random access memory structure according to claim 10, wherein the third voltage is a half of the operation voltage when the dynamic random access memory cell is operated under the normal operation mode.

12. The dynamic random access memory structure according to claim 10, wherein the transistor of the memory cell comprises a substrate coupled to a substrate bias.

13. The dynamic random access memory structure according to claim 12, wherein the substrate bias is provided by the reference clock signal.

14. The dynamic random access memory structure according to claim 9, comprising further a voltage drop apparatus which comprises a fourth transistor coupled to the switch and the first voltage, and outputs the second voltage to the switch.

15. The dynamic random access memory structure according to claim 14, wherein the voltage drop apparatus comprises a fourth transistor, and a threshold voltage of the fourth transistor is equal to a difference between the first and the second voltages.

16. The dynamic random access memory structure according to claim 9, wherein a switch operation of the switch is controlled by the first or the second voltage selected or controlled by a control signal.

17. The dynamic random access memory structure according to claim 9, wherein the switch is controlled by a sleep enable signal to output the first voltage when the dynamic random access memory structure enters the sleep mode.

18. A method of operating a dynamic random access memory structure as a compatible transistor of a static random access memory, wherein the dynamic random access memory structure comprises a memory cell, a sense amplifier and a switch, the dynamic random access memory structure is operated under either a normal operation mode or a low voltage operation mode, the method comprising:

providing a first voltage and a second voltage, and switching between the first and the second voltages as an operation voltage, wherein the first voltage is higher than the second voltage;

providing a reference clock signal as an operation signal for the operation;

refreshing a data stored in the memory cell according to a sequence frequency of the reference clock signal;

providing the second voltage as the operation voltage under the normal operation mode to provide the operation of the dynamic random access memory structure to save the operation power consumption; and providing the first voltage as the operation voltage under the low voltage operation mode to provide the operation of the dynamic random access memory structure and to retain the data stored in the memory cell.

19. The method according to claim 18, wherein the memory cell comprises a third transistor and a capacitor, one terminal of the capacitor is coupled to one source/drain region of the third transistor, the other terminal of the capacitor is coupled to a third voltage, the other source/drain region of the third transistor is coupled to a bit line, and a gate of the third transistor is coupled to a word line; wherein under the normal operation mode, the third voltage is a proportion of the operation voltage and is smaller than the third voltage; and under the low voltage operation mode, the third voltage is dependent on the reference clock signal, and when the reference clock signal is at a low voltage as logic 0, the reference clock signal drops to a zero voltage to provide a voltage required for retaining the data stored in the memory cell.

20. A method of operating a dynamic random access memory structure as a compatible transistor of a static random access memory, the dynamic random access memory structure comprising a memory cell, a sense amplifier and a switch, the dynamic random access memory structure being operated under one of a normal operation mode, a stand-by mode and a sleep mode, the method comprising:

providing a first voltage and a second voltage, and switching between the first and the second voltages as an operation voltage, wherein the first voltage is higher than the second voltage;

providing a reference clock signal as an operation signal of the method;

storing a data in the memory cell, refreshing the data stored in the memory cell according to a sequence frequency of the reference clock signal;

providing the second voltage as the operation voltage under the normal operation mode to providing the operation of the dynamic random access memory structure and to save power consumption;

providing the first or the second voltage as the operation voltage under the stand-by mode according to the reference clock signal; and providing the first voltage as the operation voltage under the sleep mode to provide the operation of the dynamic random access memory structure and to retain the data stored in the memory cell.

21. The method according to claim 20, wherein the memory cell comprises a third transistor and a capacitor, one terminal of the capacitor is coupled to one source/drain region of the third transistor, the other terminal of the capacitor is coupled to a third voltage, the other source/drain region of the third transistor is coupled to a bit line, and a gate of the third transistor is coupled to a word line; wherein under the normal operation mode, the third voltage is a proportion of the operation voltage and is smaller than the third voltage; and under the sleep mode, the third voltage is dependent on the reference clock signal, and when the reference clock signal is at a low voltage as logic 0, the reference clock signal drops to a zero voltage to provide a voltage required for retaining the data stored in the memory cell.

* * * * *